United States Patent [19]

Block et al.

[11] 4,366,497

[45] Dec. 28, 1982

[54] COOLING CAPSULE FOR DISC-SHAPED SEMICONDUCTOR COMPONENTS

[75] Inventors: Harry Block; Rudolf Wiesenbacher, both of Erlangen, Fed. Rep. of Germany

[73] Assignee: Siemens Aktiengesellschaft, Munich, Fed. Rep. of Germany

[21] Appl. No.: 158,713

[22] Filed: Jun. 12, 1980

[30] Foreign Application Priority Data

Jun. 29, 1979 [DE] Fed. Rep. of Germany ........ 2926342

[51] Int. Cl.³ .............................................. H01L 3/00
[52] U.S. Cl. ................................... 357/82; 165/80 C
[58] Field of Search ..................... 357/82; 165/89, 90, 165/92, 8 U

[56] References Cited

U.S. PATENT DOCUMENTS

| 2,015,747 | 10/1935 | Drake | 165/90 |
| 2,875,985 | 3/1959 | Hold | 165/89 |
| 3,812,404 | 5/1974 | Barken et al. | 357/82 |
| 3,823,771 | 7/1974 | Ludwig | 165/80 C |
| 3,991,396 | 11/1976 | Barkan | 357/82 |

Primary Examiner—William R. Cline
Assistant Examiner—Theophil W. Streule, Jr.
Attorney, Agent, or Firm—Kenyon & Kenyon

[57] ABSTRACT

A cooling capsule for disc-type thyristors consists of two half-shells containing spherical depressions. A lens-shaped core, arranged between the two half-shells, guides the coolant, so that only a small pressure drop takes place. In addition, large-area and uniform heat removal at both end faces of the cooling capsules is obtained. The cooling capsule can be produced and machined efficiently, since screw machine parts are used exclusively.

9 Claims, 4 Drawing Figures

COOLING CAPSULE FOR DISC-SHAPED SEMICONDUCTOR COMPONENTS

BACKGROUND OF THE INVENTION

This invention relates to a cooling capsule for disc-shaped semi-conductor components. More particularly, it relates to cooling capsules in which two cover dishes of heat-conducting material, having approximately flat and parallel faces, provide a thermally conducting connection to at least one semiconductor component and in which a core, fastened in a recess within each cover dish, defines a flow channel, from an inlet to an outlet in the side wall of the cooling capsule, for a liquid coolant.

A cooling capsule of this type is described in German Patent No. 2 160 302. In a known cooling capsule, both the cover dishes and the core are cylindrical and have the same diameter. The side wall of the cooling capsule is formed by the side wall of the core and the inlet and outlet openings lead to associated holes in the cylindrical core and go from one end face of the core to the other. Each cover dish is placed on an end face of the core and annular concentric grooves, arranged as recesses in each cover dish, serve as flow paths which connect the two holes in the core. The cylindrical core and the cover dishes having flow paths are sealed together, liquid-tight, by hollow-rivet joints. These cooling capsules are used for cooling individual disc-type thyristors or disc-type diodes; the thyristors and diodes are each clamped between two cooling capsules.

The cooling capsules are used in so-called thyristor stacks for cooling several disc-type thyristors. In such thyristor stacks, disc-type thyristors are stacked and clamped side by side, with a heat sink inserted on each side of a disc-type thyristor and resting against the heat transfer surface of the disc-type thyristor. Such a thyristor stack is shown in German Patent 1 914 790.

The thermal resistance and, thereby, the cooling capacity of a cooling capsule depend substantially on the size of the metal surface past which the coolant flows. In the known cooling capsule, a multiplicity of concentric grooves are therefore milled into the two cover dishes as flow paths. The coolant in these flow paths is continuously deflected (changing direction), which, of necessity, causes a pressure loss in the coolant. The possible cross-section of the flow paths and the length overall of the flow path is therefore circumscribed. Therefore, the maximum obtainable heat transfer, using the largest area possible between the metal of the cooling capsule and the coolant, is nevertheless limited, in the known cooling capsule, by pressure loss across the coolant path due to the structure used.

It is an object of this invention to provide a cooling capsule of the type described above in which, when a large heat transfer area is used, pressure losses are, to all intents and purposes, avoided.

SUMMARY OF THE INVENTION

According to the present invention, this problem is solved by connecting the side walls of both cover dishes to each other in a liquid-tight manner to form the side wall of the cooling capsule; by providing only one recess in each cover dish; by providing that the recess in each cover dish forms a cavity whose maximum cross-sectional area, along a line connecting the inlet and the outlet opening, corresponds approximately to the maximum cross-sectional area of the core; and by providing a core which has the shape of a plate and is so arranged in the cavity that it subdivides both the inlet and the outlet opening into separate openings for each recess.

In the cooling capsule of the invention, a single flow cavity is provided for each end face which is used for cooling a semiconductor component. In this way a large-area heat transfer over the entire end face of the cooling capsule is obtained while the coolant is deflected not at all or only slightly. Such turbulence as may occur in the two cavities created by subdivision by the plate-like core, however, improves the heat transfer between the metal surface and the coolant.

The core preferably has a profile which is tapered from the center towards both the inlet and outlet openings. When the core has such a profile, the coolant is conducted to that region in which the semiconductor component develops the greatest amount of heat. This leads to an improvement of the cooling capacity of the cooling capsule.

To improve guidance of the coolant, the shape of the recesses of the cover dishes may be matched to the profile of the core. The deflection resulting from this guidance is slight, so that the pressure drop caused thereby is practically negligible.

With cylindrical cover dishes and a circular core, it is advantageous to make the core lens-shaped and to center it appropriately in the cavity formed by the recesses. Both surfaces of such a lens-shaped core profile may be spherical and can be simply realized in production by means of an automatic lathe. This embodiment is therefore also suitable for quantity production. It is also advantageous to make the recesses of each cover plate spherical in shape. These spherical depressions can be made efficiently and, therefore, in quantity, on a screw machine. The lens-shaped core provides a hydrodynamically good flow of coolant which has a negligible pressure drop and results in large-area het exchange and uniform heat removal. A high cooling capsule cooling capacity is the result.

Spacers for centering the core can be arranged in the region of the recesses between the core and each cover dish. The spacers serve as a heat-conducting connections between the core and the two cover dishes and also promote turbulence of the coolant, improving the heat transfer. This turbulence can be further enhanced by placing the spacers in a staggered arrangement.

DETAILED DESCRIPTION OF THE INVENTION

Figure 1:
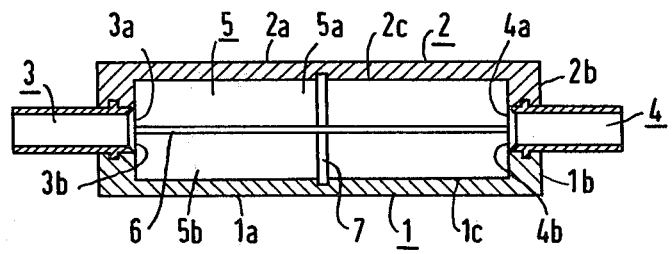
FIG. 1 is a view in partial cross-section, showing a cooling capsule fabricated in accordance with the teachings of the invention.

FIG. 1 is a view, in partial cross-section, of a simple cooling capsule embodying the teachings of the invention. This cooling capsule has two dish-shaped half-shells 1 and 2 having flat, parallel end faces 1a and 2a which serve as the thermally conducting connection for disc-shaped semiconductor components, such as disc-type thyristors. Cover dishes 1 and 2 are made of a highly heat-conductive material, preferably a metal.

The adjacent side walls 1b and 2b, respectively, of each cover dish 1 and 2, are connected to each other in a liquid-tight manner. Such a liquid-tight joint can be made by soldering, when the material of cover dishes 1 and 2 is steel, or steel alloy, and by welding, when the cover dishes are made of aluminum. It has also been found suitable to cement cover dishes 1 and 2 to each other or to connect them by a joint using hollow rivets or a roll-over. Tubing nozzles, placed in cuts in the cooling capsule side wall formed by joining wall parts 1b and 2b of cover dishes 1 and 2, serve as inlet and outlet openings 3 and 4. In order to obtain as long a flow path as possible in the cooling capsules, inlet and outlet openings 3 and 4 are preferably arranged in opposite regions of the cooling capsule side wall. Each cover dish 1 and 2 contains a recess 1c and 2c, respectively, which, in the illustrated example, has a rectangular cross-section in the plane of the drawing. Recesses 1c and 2c form interior cavity 5 in the cooling capsule. Cavity 5 is subdivided by a core 6 into two cavities 5a and 5b which serve as flow paths. In this illustrative embodiment, core 6 is shown as being shaped like a plate. Core 6 is preferably made of metal, but optionally can be poorer heat conductor, such as a plastic material. Plate-like core 6 is centered in cavity 5 by means of a spacer 7 in such a way that inlet opening 3 and outlet opening 4 are divided, respectively, into separate inlet openings 3a and 3b and separate outlet openings 4a and 4b, for the flow path of each cavity 5a and 5b. Using the cooling capsule of FIG. 1, large-area heat transfer between the coolant and cover dishes 1 and 2 is obtained at the bottoms of depressions 1c and 2c. Furthermore, since the heat flux paths in the metal between end faces 2a and 3a of cover dishes and the bottoms of depressions 2c and 3c are very small, the cooling capsule has a low thermal resistance and, therefore, a large cooling capacity. Since there is practically no deflection of the flowing coolant, there is no pressure drop in the coolant along flow paths 5a and 5b.

Figure 2:
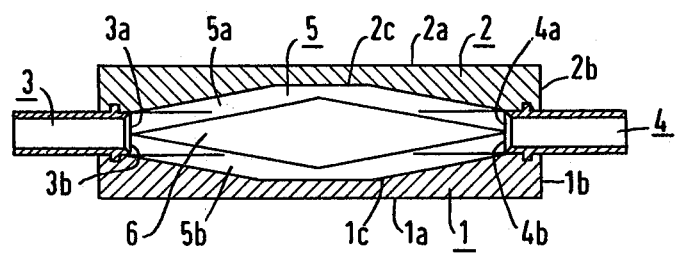
FIG. 2 is a view, in partial cross-section, of a second embodiment of the invention.

A second embodiment of the invention is illustrated in partial cross-section, in FIG. 2. This cooling capsule differs from the embodiment of FIG. 1 in that core 6 has a different profile. Here core 6 is tapered from the center of the cavity towards inlet opening 3 and toward outlet opening 4, giving it a diamond-shaped cross-section. By so profiling core 6, the coolant is conducted to the region of the heat exchange surface at which the heaviest heat development of the semiconductor component occurs, namely, into the region of the bottoms of depressions 1c and 2c, improving the heat removal. In the embodiment of FIG. 2, depressions 1c and 2c are provided with profiles which are matched to the profile of core 6 to improve the hydrodynamic flow of the coolant. By matching the profiles of core 6 and of depressions 1c and 2c, the coolant flow is only slightly deflected. The resulting pressure loss is negligible, being largely offset by the improvement in the cooling capacity due to the better hydrodynamic flow of the coolant.

Figure 3:
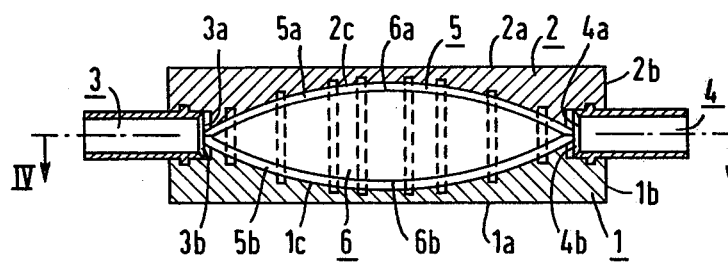
FIG. 3 is a view in partial cross-section, of a third embodiment of the invention.

A third embodiment of the invention is shown in FIG. 3. Here, the two cover dishes 1 and 2, as well as core 6, are circular, and the two surfaces 6a and 6b are spherical. Depressions 1c and 2c are also spherical and are, therefore, matched to the profile of core 6. In this manner, flow paths in cavities 5a and 5b are obtained which have good guidance of the coolant, the deflection again being only slight, even when compared to the embodiment of FIG. 2, and therefore no pressure loss occurs.

Figure 4:
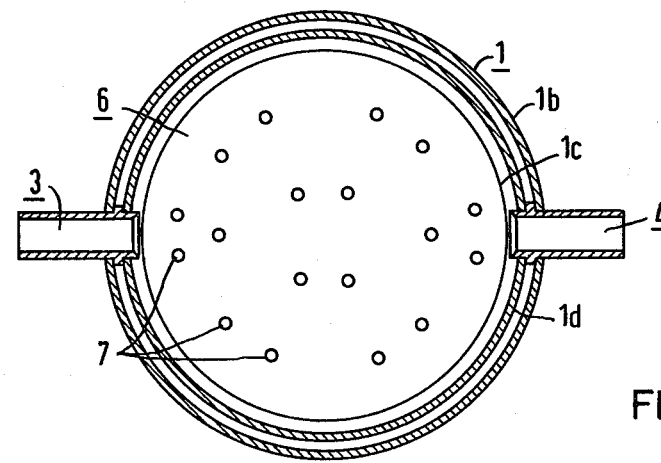
FIG. 4 is a view, in cross-section, taken along the line IV—IV of FIG. 3.

FIG. 4 is a view in cross-section, taken along the line IV—IV of FIG. 3. FIG. 4 shows the arrangement of spacers 7, which hold core 6 centered in cavity 5. The positions of spacers 7 are staggered with respect to the direction of flow from inlet opening 3 to outlet opening 4. Good turbulence of the coolant is thus achieved, improving the heat transfer and cooling capacity of the cooling capsule. If core 6 is made of a metal, such as steel, copper, or aluminum, the spacers 7, likewise made of metal, insure good heat transfer between cover dishes 1 and 2 and core 6. FIG. 4 also shows a groove 1d in cover dish 1, which can be filled with solder, for instance, to join the two cover dishes together.

Because of its cylindrical form, the embodiment of the cooling capsule shown in FIGS. 3 and 4 is especially advantageous from a manufacturing point of view. Cover dishes 1 and 2 and core 6 can be made on an automatic lathe. Only the openings in the covers for nozzles 3 and 4 cannot be made in a single operation. The embodiment of the cooling capsule according to FIGS. 3 and 4 is therefore particularly advantageous for quantity production because of the efficient production and machining.

It should further be added that depressions 1c and 2c of the two cover dishes may be of different depths. This can lead to the situation where the liquid-tight joint between two cover dishes 1 and 2d is made in the vicinity of or in the end face of one of the cover dishes.

What is claimed is:

1. A cooling capsule for disc-shaped semiconductor components comprising:

two heat conductive cover dishes, each cover dish having a substantially flat outer face for making generally conforming, thermally conductive connection to at least on semiconductor component, each dish having a side wall and containing a single recess, the side wall of one cover dish joined to the side wall of the other cover dish in a liquid-tight manner to form a side wall of the capsule, joining the recesses to provide a cavity in the capsule;

an inlet opening and an outlet opening in the side wall of the capsule to permit through flow of coolant; and a solid core positioned in the cavity so as to divide each inlet and each outlet opening in the side wall into separate inlet and outlet openings associated with each recess, the maximum cross-sectional area of the cavity, taken on a connecting line between the inlet and the outlet openings, being substantially equal to the maximum cross-sectional area of the core.

2. In a cooling capsule in accordance with claim 1, the further improvement comprising:

The core having a profile which is tapered from the center toward the inlet opening and toward the outlet opening.

3. In a cooling capsule in accordance with claim 1 the further improvement comprising:

the core being plate-like.

4. In a cooling capsule in accordance with claim 2, the further improvement comprising:

the profiles of the recesses in the cover dishes being matched to the profile of the core.

5. In a cooling capsule in accordance with any one of claims 3 and 4 in which the cover dishes and the core are circular, the further improvement comprising:

the core being lens-shaped and approximately centered in the cavity formed by the recesses.

6. In a cooling capsule in accordance with claim 5, the further improvement comprising:

the core having two spherical surfaces.

7. In a cooling capsule in accordance with claim 6, the further improvement comprising:

the recess of each cover plate being spherical.

8. In a cooling capsule in accordance with any one of claims 1, 2, 3 or 4, the further improvement comprising: spacers between the core and each cover dish in the region of the recesses.

9. In a cooling capsule in accordance with claim 5, the further improvement comprising: spacers between the core and each cover dish in the region of the recesses.

* * * * *